(12) United States Patent
Ono et al.

(10) Patent No.: US 9,991,386 B2
(45) Date of Patent: Jun. 5, 2018

(54) EPITAXIAL WAFER AND METHOD OF MANUFACTURING THE SAME

(71) Applicant: SUMCO CORPORATION, Tokyo (JP)

(72) Inventors: Toshiaki Ono, Tokyo (JP); Yumi Hoshino, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 31 days.

(21) Appl. No.: 15/138,526

(22) Filed: Apr. 26, 2016

(65) Prior Publication Data

US 2016/0240677 A1   Aug. 18, 2016

Related U.S. Application Data

(62) Division of application No. 12/634,899, filed on Dec. 10, 2009, now Pat. No. 9,362,114.

(30) Foreign Application Priority Data

Dec. 15, 2008 (JP) .................................. 2008-318897

(51) Int. Cl.
*H01L 21/02* (2006.01)
*H01L 29/78* (2006.01)
(Continued)

(52) U.S. Cl.
CPC ...... *H01L 29/7848* (2013.01); *H01L 21/0245* (2013.01); *H01L 21/02381* (2013.01);
(Continued)

(58) Field of Classification Search
CPC ......... H01L 21/02532; H01L 21/02381; H01L 21/0245; H01L 21/02658; H01L 21/3225; H01L 29/7847; C30B 1/02
See application file for complete search history.

(56) References Cited

U.S. PATENT DOCUMENTS 4,659,400 A * 4/1987 Garbis ............... H01L 21/3221
117/106
6,514,886 B1  2/2003 U'Ren
(Continued)

FOREIGN PATENT DOCUMENTS

JP     3-133121       6/1991
JP     03133121 A  *  6/1991
(Continued)

OTHER PUBLICATIONS

Schreiber Translations, English translation of JP 03-133121 (2013).*

(Continued)

*Primary Examiner* — Matthew Song
(74) *Attorney, Agent, or Firm* — Greenblum & Bernstein, P.L.C.

(57) ABSTRACT

A method of manufacturing an epitaxial wafer, including a silicon substrate having a surface sliced from single-crystalline silicon and a silicon epitaxial layer deposited on the surface of the silicon substrate, includes an oxygen concentration controlling heat treatment process in which a heat treatment of the epitaxial layer is performed under a non-oxidizing atmosphere after the epitaxial growth such that an oxygen concentration of the surface of the silicon epitaxial layer is set to $1.0 \times 10^{17}$ to $12 \times 10^{17}$ atoms/cm$^3$ (ASTM F-121, 1979).

8 Claims, 5 Drawing Sheets

(51) Int. Cl.
*H01L 21/322* (2006.01)
*H01L 29/08* (2006.01)
*H01L 29/16* (2006.01)
*H01L 29/161* (2006.01)
*H01L 29/165* (2006.01)
*H01L 29/66* (2006.01)

(52) U.S. Cl.
CPC .. *H01L 21/02532* (2013.01); *H01L 21/02658* (2013.01); *H01L 21/3225* (2013.01); *H01L 29/0847* (2013.01); *H01L 29/161* (2013.01); *H01L 29/165* (2013.01); *H01L 29/1608* (2013.01); *H01L 29/66636* (2013.01); *H01L 29/7843* (2013.01); *H01L 29/7847* (2013.01)

(56) References Cited

U.S. PATENT DOCUMENTS

| | | | |
|---|---|---|---|
| 6,885,069 | B2 | 4/2005 | Ohguro |
| 2005/0079694 | A1 | 4/2005 | Koezuka et al. |
| 2005/0098092 | A1 | 5/2005 | Wilson et al. |
| 2006/0163651 | A1* | 7/2006 | Rotondaro ........ H01L 21/26506 257/336 |
| 2006/0185581 | A1 | 8/2006 | Aga et al. |
| 2008/0087892 | A1* | 4/2008 | Wang ................... H01L 29/1054 257/51 |
| 2008/0286957 | A1* | 11/2008 | Lee ................... H01L 21/02381 438/607 |
| 2009/0205562 | A1 | 8/2009 | Wada |
| 2010/0003811 | A1 | 1/2010 | Wada |

FOREIGN PATENT DOCUMENTS

| | | |
|---|---|---|
| JP | 5-326467 | 12/1993 |
| JP | 2792785 | 6/1998 |
| JP | 2000-243946 | 9/2000 |
| JP | 2000-272995 | 10/2000 |
| JP | 2002-118254 | 4/2002 |
| JP | 2002-217413 | 8/2002 |
| JP | 2002-359201 | 12/2002 |
| JP | 2006-066532 | 3/2006 |
| JP | 2006-237235 | 9/2006 |
| JP | 2007-306028 | 11/2007 |

OTHER PUBLICATIONS

Japan Office action, dated Oct. 23, 2012 along with an English translation thereof.
Japan Office action, dated Dec. 17, 2013 along with an English translation thereof.

* cited by examiner

EPITAXIAL WAFER AND METHOD OF MANUFACTURING THE SAME

CROSS-REFERENCE TO RELATED APPLICATION

This is a divisional application of U.S. patent application Ser. No. 12/634,899, filed Dec. 10, 2009, now issued as U.S. Pat. No. 9,362,114, which claims priority of Japanese Application 2008-318897, filed on Dec. 15, 2008. The disclosures of these documents, including the specifications, drawings and claims, are incorporated herein by reference in their entirety.

BACKGROUND OF THE INVENTION

Field of the Invention

The invention relates to an epitaxial wafer and a method of manufacturing the same, and particularly, to technology suitable for an epitaxial wafer used in a process of forming a strained layer to improve a device characteristic.

Priority is claimed on Japanese Patent Application No. 2008-318897, filed Dec. 15, 2008, the content of which is incorporated herein by reference.

Description of the Related Art

As silicon devices become more and more miniaturized, the vicinity of the wafer surface which is the active layer of the device is often strained to improve device characteristics.

For example, a strained silicon wafer obtained by epitaxially growing a SiGe layer on a single-crystalline silicon wafer and epitaxially growing a strained silicon layer on the SiGe layer, a wafer obtained by changing the wafer from a SiGe layer to a nitriding of the surface, or a silicon-on-insulator (SOI) wafer have been proposed in the art.

In the strained silicon layer, a tensile strain is generated by the SiGe layer having a larger lattice constant than that of silicon. This tensile strain changes and degenerates a band structure of silicon so as to increase carrier mobility. By using the strained silicon layer as a channel region, the carrier mobility can increase 1.5 times or more in comparison with a semiconductor substrate using typical bulk silicon. Therefore, the strained silicon wafer is advantageously adaptable to a high-speed MOSFET (metal oxide semiconductor field effect transistor), a MODFET (modulation-doped field effect transistor), and a HEMT (high electron mobility transistor).

The aforementioned related techniques can be disclosed in, for example, Japanese Patent Publication No. 2792785, and Japanese Unexamined Patent Application First Publication No. 2002-118254, 2006-237235, and 2002-359201.

However, since the film stress generated by the strain added to the vicinity of the wafer surface is significantly large, and dislocation toward the wafer surface is generated from the strain, a desire to suppress the dislocation was present in the art.

Particularly, in the wafer on which a silicon epitaxial layer and a strained layer such as SiGe are formed, the epitaxial layer as a substrate surface is formed through CVD (chemical vapor deposition). Therefore, since the oxygen concentration within the epitaxial layer is very low, and extension of the generated dislocation cannot be prevented, dislocation pits may be produced during a device manufacturing process.

Accordingly, the invention is contrived in view of the above problem, and has been made to provide:

1. an epitaxial wafer having a high resistance to generation of dislocations;

2. a method of manufacturing such a silicon wafer; and 3. an epitaxial wafer that can be highly resistant to dislocation even when a high film stress is generated in the device manufacturing process after the strained layer is formed.

SUMMARY OF THE INVENTION

The inventors have found through diligent study that, in a epitaxial wafer that is provided in forming the strained layer, which generates a high film stress, and also provided in subsequent device manufacturing processes, the surface oxygen concentration is associated with generation of dislocations. The inventors guessed the reason as follows.

While the epitaxial layer is formed on the surface of the silicon wafer where the strained layer is provided, the epitaxial layer is formed through CVD (chemical vapor deposition) based on a vapor-phase growth. Theoretically, there is no oxygen within the epitaxial layer, and realistically, the oxygen concentration is extremely low, and close to zero. As a result, it is considered that, when a large amount of strain (i.e., stress) is applied near the low-oxygen portion due to the strained layer, dislocation is generated during heat treatment in subsequent device manufacturing processes or the like. Therefore, it is advantageous to improve the low-oxygen concentration state within the epitaxial layer. Specifically, as described below, it was found that generation of dislocations can be suppressed by limiting or controlling the oxygen concentration within the epitaxial layer to a predetermined range or distribution state.

More specifically, it is believed that a portion having a predetermined oxygen concentration can be located on the surface using a means for raising the oxygen concentration through out-diffusion from the bulk side in order to control the oxygen concentration within the aforementioned epitaxial layer and/or a means for removing the low-oxygen portion by grinding or etching when the out-diffusion generates a shortage of the oxygen concentration at the surface side (i.e., outer side).

Furthermore, it is believed that, in order to control the oxygen concentration within the epitaxial layer, the oxygen concentration is increased using in-diffusion (i.e., implantation) from the surface oxide film formed by an oxygen-containing atmospheric gas (i.e., under an oxidizing atmosphere). In this case, it is believed that, since the effect of the out-diffusion from the bulk side is also added, a heat treatment is finished at a lower temperature within a shorter time. Such a heat treatment includes a batch type process using an upright furnace and an RTA (rapid thermal annealing) process using a single wafer furnace, or the like. Any heat treatment method may be employed if it can control the oxygen concentration.

According to a first aspect of the invention, there is provided a method of manufacturing an epitaxial wafer including a silicon substrate which is sliced from a single-crystalline silicon and has a surface, and a silicon epitaxial layer deposited on the surface of the silicon substrate, the method including an oxygen concentration controlling heat treatment process in which a heat treatment is performed under a non-oxidizing atmosphere after epitaxial growth such that the oxygen concentration of the surface of the silicon epitaxial layer is set to $1.0 \times 10^{17}$ to $12 \times 10^{17}$ atoms/$cm^3$ (ASTM F-121, 1979).

It is preferable that the oxygen concentration of the surface of the silicon epitaxial layer be set to $3.0 \times 10^{17}$ to $10 \times 10^{17}$ atoms/$cm^3$ (ASTM F-121, 1979).

In the method of manufacturing the epitaxial wafer, since the oxygen concentration of the surface of the silicon epitaxial layer is set to $1.0 \times 10^{17}$ to $12 \times 10^{17}$ atoms/cm$^3$ (ASTM F-121, 1979), it is possible to suppress generation of dislocations even in a case where the film stress is increased through the heat treatment or the like after a strained layer is formed on the surface of the epitaxial layer. As a result, it is possible to provide a superior wafer having characteristics suitable for a high-speed MOSFET, MODFET, or HEMT using the silicon epitaxial wafer having a strained layer formed in a device manufacturing process.

More specifically, the oxygen contained in the bulk-side substrate silicon is outwardly diffused (out-diffusion) to the epitaxial layer through the heat treatment under a non-oxidizing atmosphere. As a result, the oxygen concentration of the epitaxial layer, which contains nearly no oxygen when the film is formed, can be raised to the aforementioned range. Therefore, it is possible to suppress generation of dislocations even when film stress increases through heat treatment or the like after the strained layer is formed on the surface of the epitaxial layer.

The oxygen concentration of the surface of the epitaxial layer means the oxygen concentration of the epitaxial layer in the vicinity of the surface of the epitaxial film. Specifically, the oxygen concentration means the oxygen concentration at a depth of 80 to 200 nm, preferably 100 nm when a depth profile is measured using a SIMS (secondary ion-mass spectroscopy) analysis. This is because the concentration cannot be measured at the outermost surface of the wafer using the SIMS analysis due to contamination of specimens, and the effects of in-diffusion and out-diffusion can be accurately measured.

As described above, in the process of raising the oxygen concentration at the surface of the epitaxial layer due to the out-diffusion from the bulk side, i.e., the heat treatment process under a non-oxidizing atmosphere, the oxygen concentration depth profile has a highest value on the bulk side and has a lowest value on the surface side (the outer side). The oxygen concentration is selected by supposing that the lowest value of the oxygen concentration within the epitaxial film is set to the aforementioned range. Since the portion having the lowest oxygen concentration is the portion nearest to the location where the strained layer is formed in a subsequent process, it is certainly possible to suppress generation of the dislocation caused by forming the strained layer and prevent the dislocations from extending in a wafer thickness direction by satisfying the aforementioned condition range of the oxygen concentration.

According to a second aspect of the invention, the method of manufacturing the epitaxial wafer includes a process of forming a strained layer, which generates a film stress of 10 to 1,000 MPa, on the surface of the silicon epitaxial layer, and the thickness of the silicon epitaxial layer obtained after the epitaxial growth is 2 μm or less. Preferably, the thickness is equal to or more than 0.2 μm and equal to or less than 2 μm. More preferably, the thickness is equal to or more than 0.5 μm and equal to or less than 1.5 μm. Preferably, the film stress is 50 to 500 MPa. More preferably, the film stress is 100 to 300 MPa.

In this case, since the oxygen concentration of the epitaxial layer having a strained layer is set to the aforementioned range, it is possible to suppress generation of dislocations and provide a silicon wafer for manufacturing a device having desired characteristics even when the strain layer, which generates a film stress of 10 to 1,000 MPa, is formed on the surface of the silicon epitaxial layer.

Since the thickness of the silicon epitaxial layer obtained after the epitaxial growth is 2 μm or less, a heat treatment condition for preventing dislocation from being extended, i.e., an oxygen concentration necessary to suppress dislocation can be realized within nearly the entire area in a thickness direction of the epitaxial layer due to the out-diffusion from the bulk side even in a short-time low-temperature heat treatment. That is, in the oxygen concentration controlling heat treatment process, the oxygen concentration is raised from the bulk side to the surface side of the epitaxial layer. However, when the epitaxial layer is thicker than the aforementioned range, the oxygen concentration obtained after the out-diffusion may fail to reach a reference value suitable for suppressing dislocation at the end of the oxygen concentration controlling heat treatment process. Therefore, a portion having an oxygen concentration lower than a reference value probably remains in the surface side (the outer side). Since the oxygen concentration is sufficiently raised due to the out-diffusion by setting the thickness of the epitaxial layer to be in the aforementioned range, it is possible to prevent a portion having an oxygen concentration lower than a reference value suitable for suppressing dislocation from remaining.

According to a third aspect of the invention, a method of manufacturing an epitaxial wafer includes: an oxygen concentration controlling heat treatment process in which the oxygen concentration of the silicon epitaxial layer is raised under a non-oxidizing atmosphere after the epitaxial growth; and a surface removal process in which the surface is removed such that the oxygen concentration of the surface of the silicon epitaxial layer is set to $1.0 \times 10^{17}$ to $12 \times 10^{17}$ atoms/cm$^3$ (ASTM F-121, 1979). Therefore, even when a portion at the surface side (the outer side) in which the oxygen concentration obtained after the out-diffusion does not reach a reference value suitable for suppressing dislocation remains at the end of the oxygen concentration controlling heat treatment process, it is possible to set the oxygen concentration of the epitaxial layer to a condition range capable of suppressing dislocation by removing the portion having an oxygen concentration lower than a reference value suitable for suppressing the dislocation through the surface removal process. As a result, it is possible to suppress generation of dislocations.

The thickness of the silicon epitaxial layer obtained after the epitaxial growth is 2 to 4 μm. Meanwhile, the thickness of the layer removed through the surface removal process may be 0.6 to 2.6 μm. Preferably, the thickness of the silicon epitaxial layer is 1.8 to 2 μm. More preferably, the thickness of the layer removed through the surface removal process is 1 to 1.5 μm.

In this case, it is possible to realize the oxygen concentration necessary to suppress dislocation across the nearly entire thickness of the epitaxial layer through the out-diffusion from the bulk side and the surface removal and thus, prevent generation of dislocations.

In the first to third aspects of the invention, the heat treatment temperature in the oxygen concentration controlling heat treatment process may be equal to or higher than 900° C. and lower than the melting point of silicon. Preferably, the heat treatment temperature is 950 to 1,300° C. More preferably, the heat treatment temperature is 1,000 to 1,250° C.

In this case, it is possible to supply an amount of oxygen sufficient to suppress the formation of dislocations in a thickness direction of the epitaxial layer due to the out-diffusion from the bulk side. Accordingly, it is possible to realize the oxygen concentration necessary to suppress the formation of dislocations within nearly the entire epitaxial layer.

The aforementioned methods may further include an oxide film removal process for removing an oxide film on the surface of the silicon epitaxial layer.

In the oxide film removal process, a surface removal process, such as grinding or etching using HF, is preferably employed. Accordingly, it is possible to manufacture a wafer corresponding to the surface condition with the epitaxial layer being formed on the surface.

According to a fourth aspect of the invention, a method of manufacturing an epitaxial wafer obtained by depositing a silicon epitaxial layer on a silicon substrate surface which is sliced from single-crystalline silicon includes an oxygen concentration controlling heat treatment process for raising the oxygen concentration of the silicon epitaxial layer under a treatment condition including a treatment temperature X(° C.) and a treatment time Y(sec) under an oxidizing atmosphere after the epitaxial growth, wherein the treatment temperature X is 800 to 1,400° C., and the treatment time Y is 180 min or less while the treatment temperature X and the treatment time Y satisfy the following relationship:

$$Y \cong 1.21 \times 10^{10} \exp(-0.0176X).$$

Preferably, the treatment temperature X is 900 to 1,300° C. More preferably, the treatment temperature X is 1,000 to 1,250° C. Preferably, the treatment time Y is 26 to 0.023 min. More preferably, the treatment time Y is 4.6 to 0.056 min.

In this case, it is possible to raise the oxygen concentration using in-diffusion from a surface oxide film formed under a gaseous atmosphere containing oxygen (under an oxidizing atmosphere). As a result, through a heat treatment performed after the strained layer is formed on the surface of the epitaxial layer, an oxygen concentration capable of suppressing dislocation is realized in the epitaxial layer even when the film stress increases. Therefore, it is possible to control the level of the oxygen concentration.

Since the effect of the out-diffusion from the bulk side is added by performing the heat treatment for the silicon wafer as described in the treatment under a non-oxidizing atmosphere, it is possible to control the oxygen concentration by performing the heat treatment at a lower temperature within a shorter amount of time, and it is possible to prevent a slip generated by the heat treatment. Furthermore, in a case where a wafer sliced from a single-crystalline ingot grown with a low-oxygen concentration such as $1.0 \times 10^{17}$ to $8.0 \times 10^{17}$ atoms/cm$^3$ (ASTM F-121, 1979) is used, and/or in a case where the heat treatment is performed at a low temperature within a short time, it is possible to realize the oxygen concentration necessary to suppress dislocation even when the oxygen supplied through the out-diffusion is insufficient.

Since the oxygen concentration at the surface side (the outer side) of the epitaxial layer can be higher than that at the inner side (the bulk side), it is possible to immediately stop extension of the generated dislocation.

The methods according to the first to fourth aspects of the invention may further include a strained layer formation process in which a strained layer, which generates a film stress of 10 to 1,000 MPa, is formed on the surface of the silicon epitaxial layer.

In this case, since any one of the aforementioned methods of manufacturing the epitaxial wafer includes a strained layer formation process in which a strained layer which generates a film stress of 10 to 1,000 MPa is formed on the surface of the silicon epitaxial layer, it is possible to set the oxygen concentration within epitaxial layer having the strained layer to be within the aforementioned range even when such a film stress is generated. Therefore, it is possible to provide a silicon wafer for manufacturing a device having a desired device characteristic and structure while generation of the dislocation can be suppressed.

As described above, according to the invention, it is possible to provide an epitaxial wafer capable of suppressing dislocation even when a high film stress is generated by the strained layer.

DETAILED DESCRIPTION OF THE INVENTION

Hereinafter, a method of manufacturing an epitaxial wafer according to a first embodiment of the invention will be described with reference to the accompanying drawings.

Figure 1:
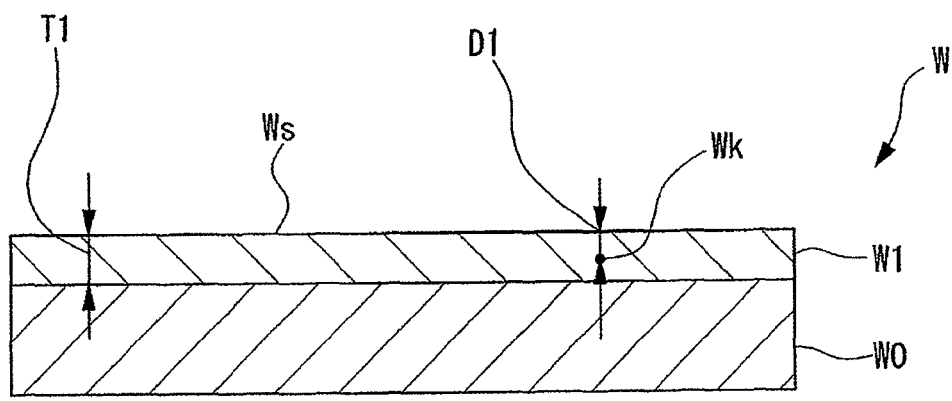
FIG. 1 is a front cross-sectional view illustrating an epitaxial wafer according to a first embodiment of the invention.
Figure 2:
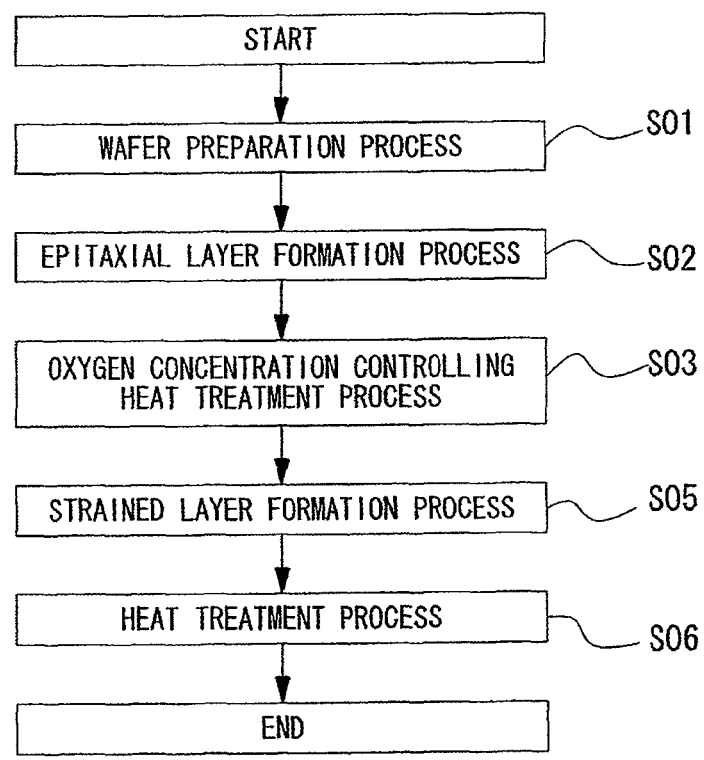
FIG. 2 is a flowchart illustrating a method of manufacturing an epitaxial wafer according to a first embodiment of the invention.

FIG. 1 is a front cross-sectional view illustrating an epitaxial wafer according to a first embodiment of the invention, and FIG. 2 is a flowchart illustrating a method of manufacturing an epitaxial wafer according to a first embodiment of the invention, in which the reference symbol W denotes an epitaxial wafer.

Referring to FIG. 1, the epitaxial wafer W according to a first embodiment of the invention is manufactured by forming an epitaxial layer W1 on a surface of a silicon substrate W0 obtained by growing a single-crystalline ingot using a CZ (Czochralski) method or the like and then slicing the ingot.

The thickness T1 of the epitaxial layer W1 is 1.5 to 2.5 µm, preferably about 2 µm. The surface oxygen concentration of the epitaxial layer W1 is $1.0 \times 10^{17}$ to $12 \times 10^{17}$ atoms/cm$^3$, and more preferably $3 \times 10^{17}$ to $10 \times 10^{17}$ atoms/cm$^3$.

The surface oxygen concentration Oi is measured at a measurement point Wk located at a depth D1 of 80 to 200 nm, and preferably 100 nm.

Referring to FIG. 2, a method of manufacturing the epitaxial wafer W according to a first embodiment of the invention includes a wafer preparation process S01, an epitaxial layer formation process S02, an oxygen concentration controlling heat treatment process S03, a strained layer formation process S05, and a heat treatment process S06.

In the method according to a first embodiment of the invention, the wafer preparation process S01 shown in FIG. 2 includes any process for preparing the silicon wafer W0 having a mirror-finished surface. Specifically, the silicon wafer W0 may be prepared by performing various processes such as slicing, corner-chamfering, grinding, wrapping, etching, polishing, cleaning, and a heat treatment such as DK for a single-crystalline silicon ingot grown using a CZ (Czochralski) method, a MCZ (magnetic CZ) method, or the like.

In the epitaxial layer formation process S02 shown in FIG. 2, the silicon epitaxial layer W1 having a predetermined thickness is formed on the surface of the silicon wafer W0. It is noted that the epitaxial layer W1 is formed at a temperature of 1150 to 1280° C. under a gaseous atmosphere containing trichlorosilane or the like. Also, necessary dopants such as boron or phosphorous may be added. It is noted that the layer is formed until the thickness T1 of the epitaxial layer W1 becomes 1.5 to 2.5 µm, preferably about 2 µm. If the thickness T1 of the epitaxial layer W1 is set as described above, it is possible to allow the epitaxial layer W1 to have a necessary oxygen concentration by generating out-diffusion under a non-oxidizing atmosphere through the oxygen concentration controlling heat treatment process S03 without removing the surface thereafter.

In the oxygen concentration controlling heat treatment process S03 shown in FIG. 2, conditions such as a treatment temperature and treatment time are set such that the heat treatment temperature is equal to or higher than 900° C. and lower than a melting point of silicon, and the surface oxygen concentration of the epitaxial layer W1 is $1.0 \times 10^{17}$ to $12 \times 10^{17}$ atoms/cm$^3$.

It is noted that the heat treatment includes a batch type process using an upright furnace and a rapid thermal annealing (RTA) process using a single wafer furnace, or the like, and any heat treatment method can be employed without limitation if it can control the oxygen concentration within the aforementioned range. Furthermore, a temperature rising rate or a temperature falling rate may be set without limitation if the oxygen concentration can be controlled.

The oxygen concentration controlling heat treatment process S03 according to a first embodiment of the invention is performed under a non-oxidizing atmosphere. Specifically, the atmospheric gas may include argon, hydrogen, HCl, nitrogen, an inert gas, or a mixture thereof.

Figure 7A:
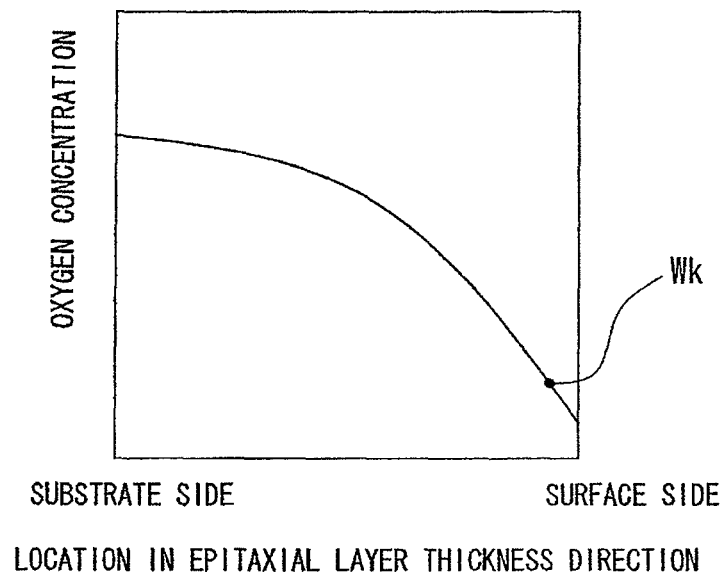
FIG. 7A is a pattern diagram illustrating distribution of an oxygen concentration in a film-depth direction when an oxygen concentration controlling heat treatment process is performed under a non-oxidizing atmosphere for the epitaxial layer according to the invention.

In the oxygen concentration controlling heat treatment process S03, the epitaxial wafer W including the epitaxial layer W1 having an oxygen concentration set to a predetermined condition is manufactured by the oxygen out-diffused from the silicon wafer W0. It is noted that the oxygen concentration of the epitaxial layer W01 is gradually reduced from the silicon substrate W0 side to the surface side as shown in FIG. 7A, and has a depth profile equal to or more than $1.0 \times 12^{17}$ atoms/cm$^3$ at the measurement point Wk.

In the strained layer formation process S05 shown in FIG. 2, the strained layer which generates a film stress of 10 to 1,000 MPa on the surface of the epitaxial layer W1 having an oxygen concentration set to a predetermined condition is formed in the epitaxial wafer W according to a first embodiment of the invention as described below.

The heat treatment process S06 shown in FIG. 2 may include, for example, a heat treatment process in a device manufacturing process. In the heat treatment process S06, even when a film stress of 80 to 1,000 MPa is generated by the strained layer, the epitaxial wafer W according to a first embodiment of the invention can prevent generation of dislocations.

Hereinafter, an epitaxial wafer and a method of manufacturing the same according to a second embodiment of the invention will be described with reference to the accompanying drawings.

Figure 3:
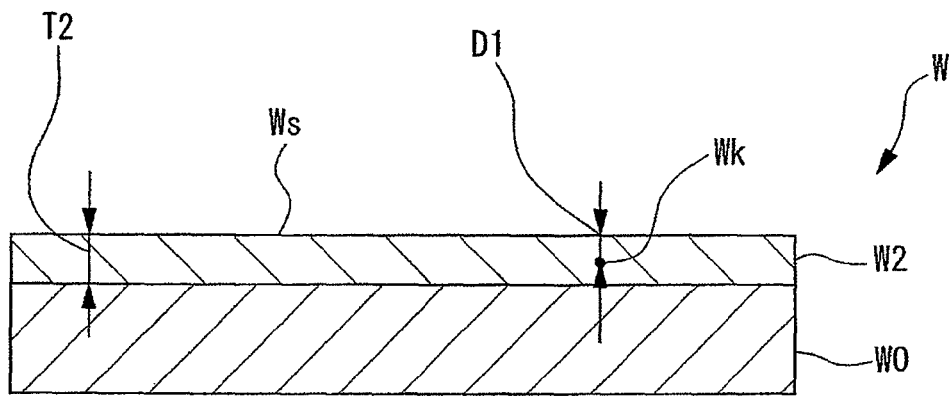
FIG. 3 is a front cross-sectional view illustrating an epitaxial wafer according to a second embodiment of the invention.
Figure 4:
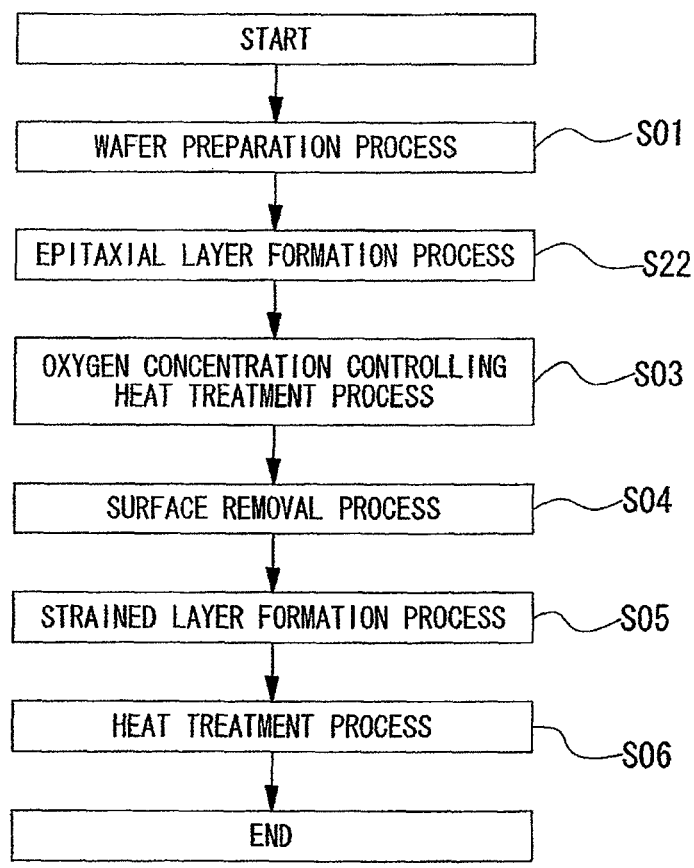
FIG. 4 is a flowchart illustrating a method of manufacturing an epitaxial wafer according to a second embodiment of the invention.

FIG. 3 is a front cross-sectional view illustrating the epitaxial wafer according to a second embodiment of the invention, and FIG. 4 is a flowchart illustrating a method of manufacturing the epitaxial wafer according to a second embodiment of the invention.

According to a second embodiment of the invention, the thickness T2 of the epitaxial layer W2 and the surface removal process S04 are different from those of the first embodiment of the invention. Therefore, like elements will be denoted by like reference symbols, and the description thereof will be omitted.

Referring to FIG. 3, the epitaxial wafer W according to a second embodiment of the invention is obtained by forming the epitaxial layer W2 on the surface of the silicon substrate W0.

The thickness T2 of the epitaxial layer W2 is 1.5 to 2.5 µm, and preferably about 2 µm.

Referring to FIG. 4, the method of manufacturing the epitaxial wafer according to a second embodiment of the invention includes a wafer preparation process S01, an epitaxial layer formation process S22, an oxygen concentration controlling heat treatment process S03, a surface removal process S04, a strained layer formation process S05, and a heat treatment process S06.

According to a second embodiment of the invention, in the epitaxial layer formation process S22 shown in FIG. 4, the silicon epitaxial layer W2 having a predetermined thickness is formed on the surface of the silicon wafer W0. It is noted that the thickness T2 of the epitaxial layer W2 is set to 2 to 4 µm or 3.5 to 4.5 µm, and preferably about 4 µm. If the thickness T2 of the epitaxial layer W2 is set as described above, it is possible to allow the epitaxial layer W2 to have a necessary oxygen concentration by out-diffusion in the oxygen concentration controlling heat treatment process S03 and removing the surface of the epitaxial layer W2 in the surface removal process S04 thereafter.

The surface removal process S04 shown in FIG. 4 is to remove a low-oxygen portion near the surface which fails to satisfy the condition that the oxygen concentration is $1.0 \times 10^{17}$ to $12 \times 10^{17}$ atoms/cm$^3$ even by the out-diffusion. The low-oxygen portion may be removed by a grinding process similar to that of the wafer preparation process S01 or a HF process such as an etching process, but any process may be employed without limitation if the low-oxygen portion can be sufficiently removed.

If the surface removal process S04 is performed by grinding, the grinding thickness may be 0.3 to 3 μm or 0.6 to 2.6 μm.

The epitaxial wafer W according to a second embodiment of the invention can prevent generation of dislocations because the low-oxygen portion is removed even when a film stress of 10 to 1,000 MPa is generated by the strained layer in the heat treatment process S06 shown in FIG. 4.

Hereinafter, a method of manufacturing an epitaxial wafer according to a third embodiment of the invention will be described with reference to the accompanying drawings.

Figure 5:
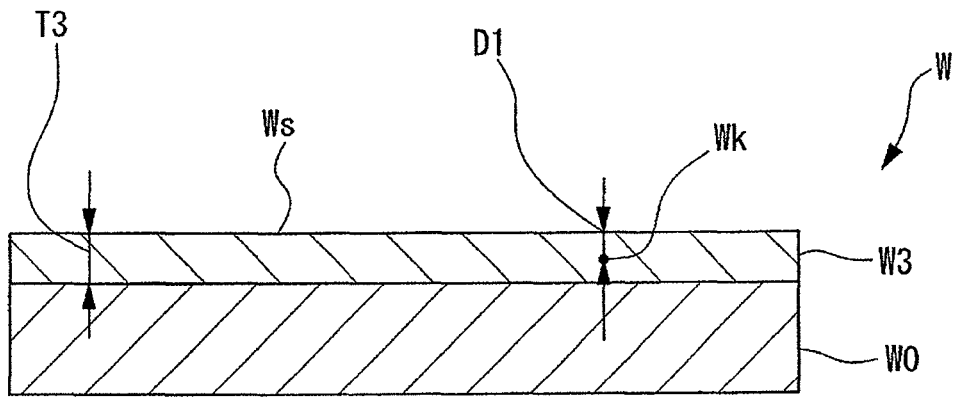
FIG. 5 is a front cross-sectional view illustrating an epitaxial wafer according to a third embodiment of the invention.
Figure 6:
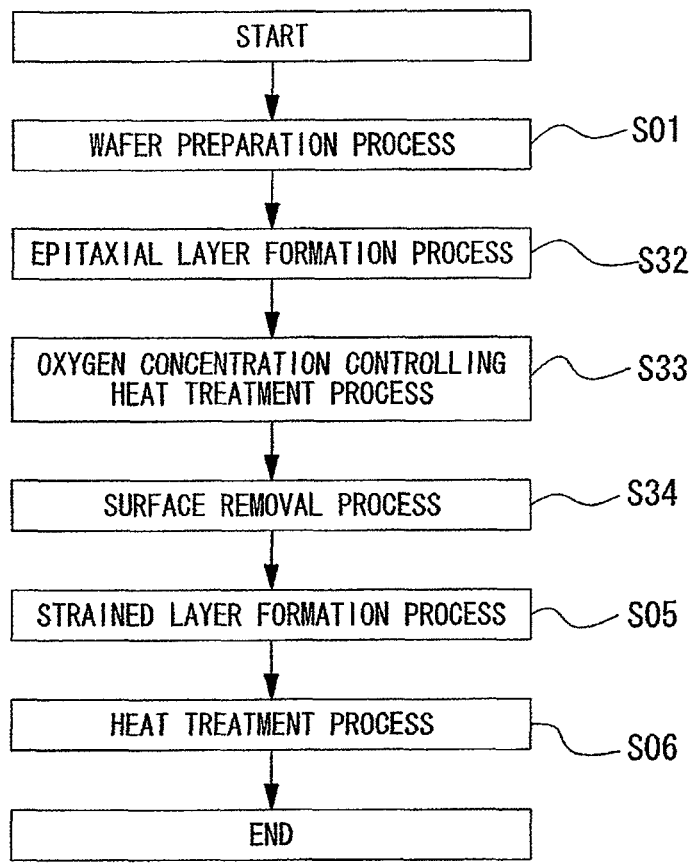
FIG. 6 is a flowchart illustrating a method of manufacturing an epitaxial wafer according to a third embodiment of the invention.

FIG. 5 is a front cross-sectional view illustrating an epitaxial wafer according to a third embodiment of the invention, and FIG. 6 is a flowchart illustrating a method of an epitaxial wafer according to a third embodiment of the invention.

According to a third embodiment of the invention, the epitaxial layer W3, the oxygen concentration controlling heat treatment process S33, and the surface removal process S34 are different from those of first and second embodiments of the invention. Therefore, like elements will be denoted by like reference symbols, and the description thereof will be omitted.

Referring to FIG. 5, the epitaxial wafer W according to a third embodiment of the invention is obtained by forming the epitaxial layer W3 on the surface of the silicon substrate W0.

The thickness T3 of the epitaxial layer W3 is 3.5 to 4.5 μm, and preferably about 4 μm.

Referring to FIG. 6, the method of manufacturing the epitaxial wafer according to a third embodiment of the invention includes a wafer preparation process S01, an epitaxial layer formation process S32, an oxygen concentration controlling heat treatment process S33, a surface removal process S34, a strained layer formation process S05, and a heat treatment process S06.

According to a third embodiment of the invention, in the epitaxial layer formation process S32 shown in FIG. 6, the silicon epitaxial layer W3 having a predetermined thickness is formed on the surface of the silicon wafer W0. It is noted that the thickness T3 of the epitaxial layer W3 is 2 to 6 μm or 3.5 to 5.5 μm, and preferably about 4 μm.

In the oxygen concentration controlling heat treatment process S33 shown in FIG. 6, conditions such as a treatment temperature and treatment time are set such that the heat treatment temperature is equal to or higher than 900° C. and lower than a melting point of silicon, and the surface oxygen concentration of the epitaxial layer W3 is $1.0 \times 10^{17}$ to $10 \times 12^{17}$ atoms/cm³.

It is noted that the heat treatment includes a batch type process using an upright furnace, a rapid thermal annealing (RTA) process using a single wafer furnace, or the like, and any heat treatment method can be employed without limitation if it can control the oxygen concentration within the aforementioned range. Furthermore, a temperature rising rate or a temperature falling rate may be set without limitation if the oxygen concentration can be controlled.

The oxygen concentration controlling heat treatment process S33 according to a third embodiment of the invention is performed under an oxidizing atmosphere. Specifically, the atmospheric gas may include oxygen, an inert gas containing oxygen, or a mixture of oxygen and a non-oxidizing gas. When a mixture of oxygen and a non-oxidizing gas is selected, it is preferable to set the oxygen gas concentration to 3% or more.

As a result of the oxygen concentration controlling heat treatment process S33, an oxide film is formed on the surface of the epitaxial layer W3, and also, the epitaxial wafer W having the epitaxial layer W3, of which the oxygen concentration is set to a predetermined condition by the in-diffused oxygen, is manufactured.

Figure 7B:
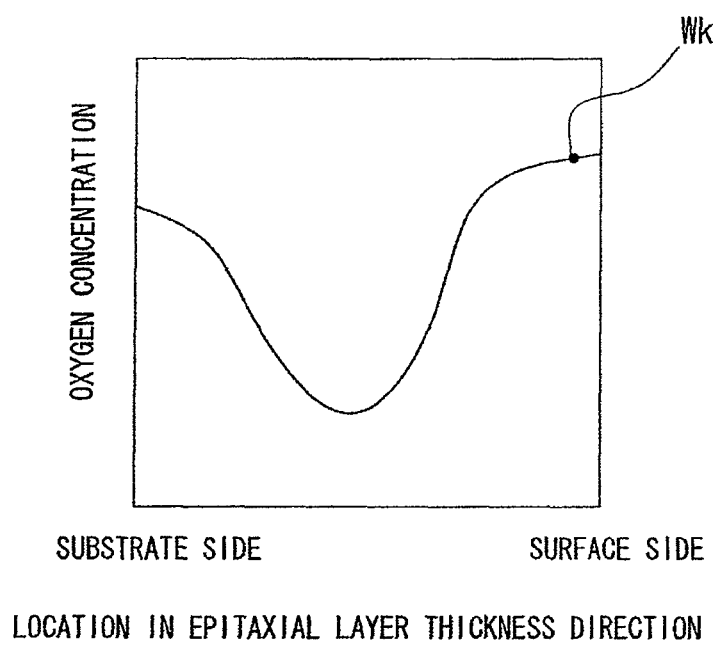
FIG. 7B is a pattern diagram illustrating distribution of an oxygen concentration in a film-depth direction when an oxygen concentration controlling heat treatment process is performed under an oxidizing atmosphere for the epitaxial layer according to the invention.

At the same time, the oxygen concentration of the epitaxial layer W3 is raised by the out-diffusion from the silicon wafer W0. Therefore, the oxygen concentration within the epitaxial layer W03 is distributed in an M-curve shape as shown in FIG. 7B.

The surface removal process S34 shown in FIG. 6 is an oxide film removal process to remove an oxide film formed on the surface of the silicon epitaxial layer W3. Specifically, the oxide film can be removed from the surface of the wafer using a diluted HF solution.

The epitaxial wafer W according to a third embodiment of the invention can prevent generation of dislocations because the low-oxygen portion is removed even when a film stress of 10 to 1,000 MPa is generated by the strained layer in the heat treatment process S06 shown in FIG. 6.

Hereinafter, a strained layer formation process S05 for providing the epitaxial wafer W manufactured according to each of the aforementioned embodiments will be described.

Figure 8:
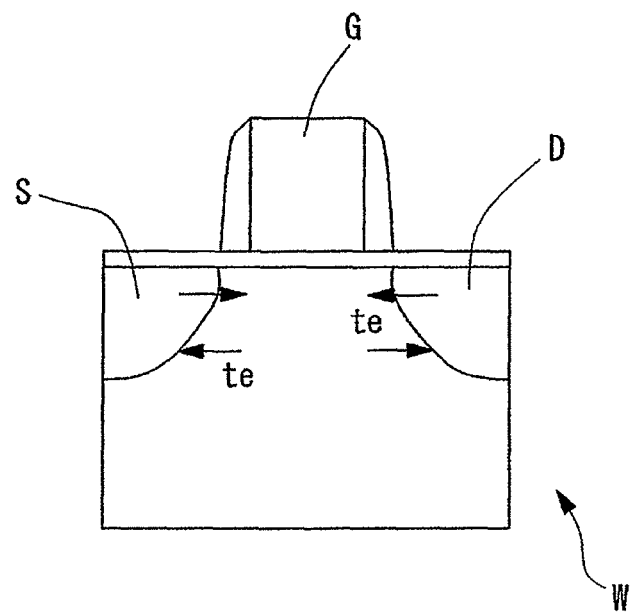
FIG. 8 is a cross-sectional view illustrating an example of a semiconductor substrate having a strained layer in a device manufacturing process in which an epitaxial wafer is provided.

FIG. 8 illustrates a cross-sectional structure as an example of a semiconductor substrate having a strained layer in a device manufacturing process in which the epitaxial wafer manufactured based on the methods according to the invention is provided.

In the strained layer formation process S05, a strained layer is partially formed on the surface of the epitaxial wafer W so as to form a strained layer as a part of the device. The strained layer generates a film stress of 10 to 1,000 MPa. Specifically, referring to FIG. 8, the strained layer is partially formed on the surface of the epitaxial wafer W as source region S and drain region D except for an area directly under the gate region G so as to become a SiGe film, a nitride film, a SiC, or the like which generates a film stress toward an in-plane direction of the wafer surface as indicated by arrows te in the drawing. The construction is not limited to that shown in FIG. 8, and also, the manufacturing method is not particularly limited if they can generate film stress.

Since the strained layer formation process S05 can be included in a device manufacturing process, the epitaxial wafer W according to the invention is a wafer provided in the device manufacturing process.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXAMPLES

Hereinafter, examples according to the invention will be described.

Example 1

In Example 1, an Si layer having a predetermined thickness was epitaxially grown on a wafer sliced from a CZ single-crystalline wafer having a diameter of 300 mm and mirror-finished. In Examples 2 to 6, a heat treatment was performed for the same sample as that of Example 1 at 1,000° C./0.5 hrs under an Ar atmosphere using an upright furnace. In Examples 7 to 12, a heat treatment was performed at 1,150° C./30 sec under an Ar atmosphere using an RTA process furnace. Then, the wafer obtained through the heat treatment was ground from the surface side to produce samples by a predetermined thickness. The specifications of the samples are shown in Table 1 as follows.

TABLE 1

|  | Substrate Oxygen Concentration (E17 atoms/cc) | Epi Layer Thickness (μm) | Heat Treatment | Grinding Thickness (μm) | Surface Oxygen Concentration (E17 atoms/cc) | Amount of Dislocation |
|---|---|---|---|---|---|---|
| Example 1 | 13.2 | 2 | N/A | N/A | Undetectable | C |
| Example 2 | 13.1 | 2 | 1000° C./0.5 hr | 0.3 | 1.2 | B |
| Example 3 | 13.2 | 2 | 1000° C./0.5 hr | 1 | 3.3 | A |
| Example 4 | 13.2 | 4 | 1000° C./0.5 hr | 0.3 | Undetectable | C |
| Example 5 | 13 | 4 | 1000° C./0.5 hr | 1.1 | 1.1 | B |
| Example 6 | 13.1 | 4 | 1000° C./0.5 hr | 2.1 | 2.6 | B |
| Example 7 | 12.9 | 2 | 1150° C./30 sec | N/A | Undetectable | C |
| Example 8 | 13 | 2 | 1150° C./30 sec | 0.5 | Undetectable | C |
| Example 9 | 13 | 2 | 1150° C./30 sec | 1 | 2.3 | B |
| Example 10 | 12.9 | 4 | 1150° C./30 sec | 0.5 | Undetectable | C |
| Example 11 | 13.2 | 4 | 1150° C./30 sec | 1 | Undetectable | C |
| Example 12 | 13 | 4 | 1150° C./31 sec | 2.6 | 1.08 | B |

Table 1 shows results of measuring the oxygen concentration at the surface layer of the wafer with respect to each sample using the SIMS (secondary-ion mass spectrometry) analysis. In the SIMS analysis, the outermost surface of the wafer cannot be measured due to contamination of specimens. Therefore, the oxygen concentration measured at a depth of 100 nm, which is not influenced by contamination, is shown in Table 1 as "the surface oxygen concentration".

Subsequently, a stress loading test was performed. A line-like hollow having a depth of 100 nm, a width of 50 μm, and a length of 1 mm was prepared on the wafer surface side of the sample, and the sample was sliced by a length of 3 cm and a width of 1.5 cm. A three-point bend test was performed for the sliced sample by setting a point interval to 2 cm. In the three-point bend test, a tensile stress was loaded to the wafer surface side, the test temperature was 800° C., and a load of 50 N was applied. Then, the sample was cooled to room temperature, a Wright etching was performed as much as 2 μm, and dislocation pits generating from the line-like hollow were measured.

In Table 1, "C" denotes a case where the number of the dislocation pits is $1.0 \times 10^5/\text{cm}^2$ or more, "B" denotes a case where the number of the dislocation pits is $1.0 \times 10^4/\text{cm}^2$ or less, "A" denotes a case where no dislocation pits are detected.

The surface oxygen concentration cannot be detected directly after the epitaxial growth because the epitaxial growth is a CVD growth, and the oxygen, which is regarded as an impurity, is hardly present during the epitaxial growth. If a heat treatment is further performed for this wafer, the oxygen contained in the substrate is thermally diffused to the surface side, and the oxygen resides in the epitaxial layer. Also, it is understood that generation of dislocations is suppressed if the surface oxygen concentration of the wafer surface is higher than $1.0 \times 10^{17}$ atoms/cm$^3$.

It is believed that, when the three-point bend test and the stress loading test are performed for the line-like hollow formed on the wafer surface, the stress is concentrated, and the dislocations is generated. However, when the oxygen concentration is high at the portion on which the stress is concentrated, a critical stress for generating the dislocation increases, and generation of dislocations is suppressed.

Comparing Examples 7 to 12, as the epitaxial layer is grown thinner, the dislocation can be more effectively suppressed using a shallow grinding depth. It is believed that this is because the oxygen is thermally diffused from the substrate to the surface side, and the oxygen concentration within the epitaxial layer becomes higher as the thickness of the epitaxial layer obtained after the growth is thinner.

Example 2

Figure 9:
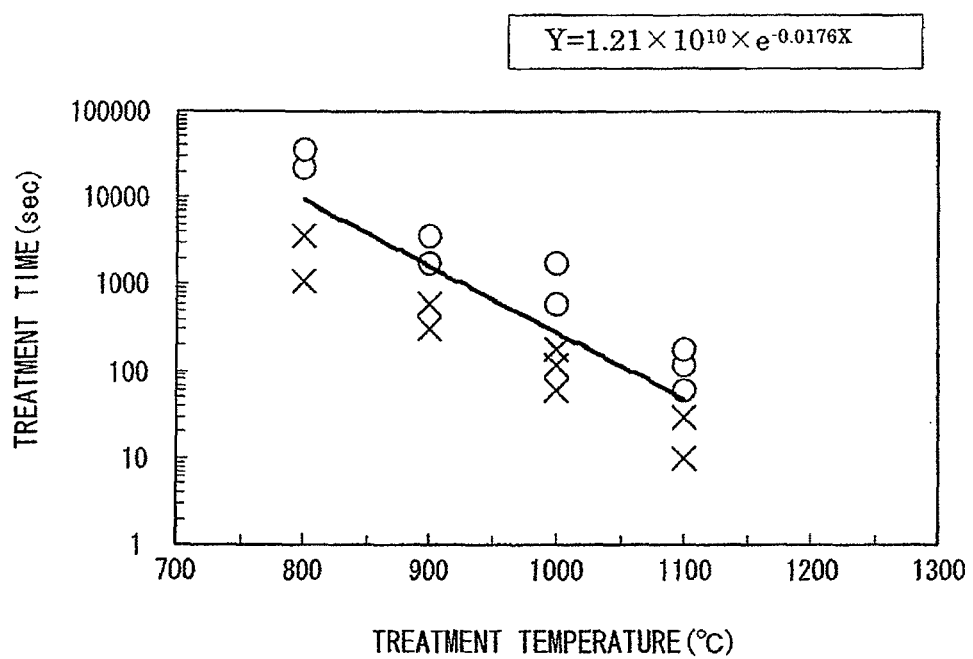
FIG. 9 is a graph illustrating relationship between a treatment temperature and a treatment time during an oxygen concentration controlling heat treatment process according to an embodiment of the invention and the result of the heat treatment.

In Example 2, an Si layer having a predetermined thickness was epitaxially grown on a wafer sliced from a CZ single-crystalline wafer having a diameter of 300 mm and mirror-finished. The thickness of the grown epitaxial layer was 4 μm. Then, various kinds of heat treatments were performed. The heat treatment was performed in an RTA furnace under an oxidizing atmosphere if the treatment time is 180 sec or less. Meanwhile, the heat treatment was performed in an upright furnace under a mixture gas atmosphere ($N_2$ and $O_2$ ($O_2$=10%)) if the treatment time is 180 sec or more. After the heat treatment, the generated oxide film was removed using a diluted HF solution, and a stress loading test was performed in a way similar to Example 1. The result is shown in FIG. 9.

According to the result, it is understood that the oxygen concentration of the epitaxial layer becomes high because the surface of the epitaxial layer is oxidized under an oxidizing atmosphere, the oxygen is inwardly diffused (i.e., implantation) from the surface, and the oxygen is thermally diffused from the substrate side. Furthermore, in order to obtain a dislocation suppression effect, it is necessary to set the heat treatment condition such that the treatment temperature X(° C.) and the treatment time Y(sec) satisfy the following relationship:

$$Y \gtrsim 1.21 \times 10^{10} \exp(-0.0176X).$$

What is claimed is:
1. A method of manufacturing an epitaxial wafer comprising:
   depositing a silicon epitaxial layer having a thickness of 2 to 4 μm on a surface of a silicon substrate which is sliced from a single-crystalline silicon, and obtaining an epitaxial wafer body;
   heating the epitaxial wafer body under a non-oxidizing atmosphere at 900° C. or higher and lower than a melting point of silicon after the depositing of the silicon epitaxial layer, diffusing oxygen contained in the silicon substrate to the silicon epitaxial layer, and raising an oxygen concentration of the silicon epitaxial layer;

removing a surface region of a thickness of 0.6 to 2.6 µm from a surface of the epitaxial layer, and setting the oxygen concentration of the surface of the silicon epitaxial layer to $1.0 \times 10^{17}$ to $12 \times 10^{17}$ atoms/cm$^3$ (ASTM F-121, 1979); and forming a strained layer for generating a film stress of 10 to 1,000 MPa on the surface of the silicon epitaxial layer.

2. The method of manufacturing an epitaxial wafer according to claim 1, wherein the oxygen concentration of the surface of the silicon epitaxial layer after the surface removal is set to $3.0 \times 10^{17}$ to $10 \times 10^{17}$ atoms/cm$^3$ (ASTM F-121, 1979).

3. The method of manufacturing an epitaxial wafer according to claim 1, wherein the oxygen concentration of the surface of the silicon epitaxial layer after the surface removal is an oxygen concentration measured at a depth of 100 nm using secondary ion-mass spectroscopy (SIMS) analysis.

4. The method of manufacturing an epitaxial wafer according to claim 1, wherein the film stress is 50 to 500 MPa.

5. The method of manufacturing an epitaxial wafer according to claim 1, wherein the film stress is 100 to 300 MPa.

6. The method of manufacturing an epitaxial wafer according to claim 1, wherein the heating the epitaxial wafer body under a non-oxidizing atmosphere is at 950 to 1300° C.

7. The method of manufacturing an epitaxial wafer according to claim 1, wherein the heating the epitaxial wafer body under a non-oxidizing atmosphere is at 1000 to 1250° C.

8. The method of manufacturing an epitaxial wafer according to claim 1, wherein a number of dislocation pits is $1.0 \times 10^4$/cm$^2$ or less when the manufactured epitaxial wafer is subjected to a stress loading test having the steps of:

forming a line-like hollow having a depth of 100 nm, a width of 50 µm, and a length of 1 mm on the surface of the manufactured epitaxial wafer;

slicing the epitaxial wafer by a length of 3 cm and a width of 1.5 cm to prepare a test piece;

performing a three-point bend test for the test piece by setting a point interval to 2 cm;

loading a tensile stress to the surface of the test piece under a condition of a test temperature of 800° C. and a load of 50 N;

cooling the test piece to room temperature;

performing a Wright etching of 2 µm on the test piece; and measuring dislocation pits generating from the line-like hollow.

* * * * *